United States Patent
Wan et al.

(10) Patent No.: US 12,002,397 B2
(45) Date of Patent: Jun. 4, 2024

(54) GOA CIRCUIT AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Peng Wan, Shenzhen (CN); Jianhong Chen, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/622,388

(22) PCT Filed: Dec. 13, 2021

(86) PCT No.: PCT/CN2021/137507
§ 371 (c)(1),
(2) Date: Dec. 23, 2021

(87) PCT Pub. No.: WO2023/102956
PCT Pub. Date: Jun. 15, 2023

(65) Prior Publication Data
US 2024/0038115 A1  Feb. 1, 2024

(30) Foreign Application Priority Data
Dec. 7, 2021 (CN) .......................... 202111484678.8

(51) Int. Cl.
*G09G 3/20* (2006.01)

(52) U.S. Cl.
CPC ....... *G09G 3/20* (2013.01); *G09G 2300/0408* (2013.01); *G09G 2310/0267* (2013.01); *G09G 2310/08* (2013.01); *G09G 2320/0223* (2013.01)

(58) Field of Classification Search
CPC ............ G09G 3/20; G09G 2300/0408; G09G 2310/0267; G09G 2310/08
See application file for complete search history.

(56) References Cited

U.S. PATENT DOCUMENTS

2014/0218346 A1   8/2014   Huang
2016/0125824 A1   5/2016   Dai
(Continued)

FOREIGN PATENT DOCUMENTS

CN   102129845 A       7/2011
CN   102968969   *     3/2013   ............... G09G 3/36
(Continued)

OTHER PUBLICATIONS

PCT International Search Report for International Application No. PCT/CN2021/137507, dated Aug. 30, 2022, 10pp.
(Continued)

*Primary Examiner* — Lisa S Landis
(74) *Attorney, Agent, or Firm* — The Roy Gross Law Firm, LLC; Roy Gross

(57) ABSTRACT

A GOA circuit and a display panel are provided in the present application. The GOA circuit includes multi-stage cascaded GOA units. An N-th stage GOA unit includes a pull-up control module, a pull-up module, a chamfering control module, and a pull-down module. The chamfering control module is electrically connected to an N-th stage scan signal output terminal to pull down a potential of the N-th stage scan signal before the pull-down module pulling down a potential of a first node and the potential of the N-th
(Continued)

stage scan signal, under control of a chamfering control signal and a first reference low level signal.

20 Claims, 5 Drawing Sheets

(56) References Cited

U.S. PATENT DOCUMENTS

| | | |
|---|---|---|
| 2016/0125830 A1 | 5/2016 | Xiao |
| 2016/0140922 A1 | 5/2016 | Dai et al. |
| 2016/0275887 A1 | 9/2016 | Xiao |
| 2016/0351152 A1 | 12/2016 | Dai |

FOREIGN PATENT DOCUMENTS

| | | |
|---|---|---|
| CN | 102968969 A | 3/2013 |
| CN | 105206248 A | 12/2015 |
| CN | 205092045 U | 3/2016 |
| CN | 106057116 A | 10/2016 |
| CN | 106128409 A | 11/2016 |
| CN | 107492362 A | 12/2017 |
| CN | 107731180 A | 2/2018 |
| CN | 208433206 U | 1/2019 |
| JP | 2020513592 A | 5/2020 |
| WO | 2014054518 A1 | 4/2014 |
| WO | 2016008190 A1 | 1/2016 |

OTHER PUBLICATIONS

PCT Written Opinion of the International Searching Authority for International Application No. PCT/CN2021/137507, dated Aug. 30, 2022, 8pp.

Chinese Office Action issued in corresponding Chinese Patent Application No. 202111484678.8 dated Jan. 19, 2023, pp. 1-6, 13pp.

Japanese Office Action issued in corresponding Japanese Patent Application No. 特願 2021-577828 dated Feb. 6, 2024, pp. 1-4, 8pp.

* cited by examiner

GOA CIRCUIT AND DISPLAY PANEL

CROSS REFERENCE TO RELATED APPLICATIONS

This application is a National Phase of PCT Patent Application No. PCT/CN2021/137507 having International filing date of Dec. 13, 2021, which claims the benefit of priority of Chinese Application No. 202111484678.8 filed on Dec. 7, 2021. The contents of the above applications are all incorporated by reference as if fully set forth herein in their entirety.

BACKGROUND OF DISCLOSURE

Field of Disclosure

The present disclosure relates to a field of display technology, in particular to a GOA circuit and a display panel.

Description of Prior Art

Gate driver on array (GOA) technology means a gate driving circuit is integrated into an array substrate of a display panel to realize a driving mode of progressive scanning, so that a gate driving circuit portion can be omitted, a manufacturing cost can be reduced, and a panel narrow frame design can be realized, which is used for a variety of displays.

Due to the presence of resistance-capacitance delay (RC delay) in a display panel, a scan signal waveform at different positions of the display panel varies with transmission loss of the scan signal. The larger a size of the display panel, the more severe deterioration of the scan signal waveform, and problems such as flickering, poor uniformity of charging rate, and severe color deviation easily occur, thereby affecting a display effect of the display panel.

SUMMARY OF DISCLOSURE

The present disclosure provides a GOA circuit and a display panel to solve a technical problem that a scan signal waveform at different positions of the display panel varies greatly due to RC delay, and further affects a display effect of the display panel.

The present disclosure provides a gate driver on array (GOA) circuit, comprising multi-stage cascade GOA units, wherein an N-th stage GOA unit comprises a pull-up control module, a pull-up module, a chamfering control module, and a pull-down module;
  the pull-up control module is connected to an (N−m)-th stage scan signal, and is electrically connected to a first node, and the pull-up control module is configured to output the (N−m)-th stage scan signal to the first node under control of the (N−m)-th stage scan signal, wherein N and m are integers greater than zero, and N>m;
  the pull-up module is connected to a clock signal and is electrically connected to the first node and an N-th stage scan signal output terminal, and the pull-up module is configured to output the N-th stage scan signal under control of a potential of the first node and the clock signal;
  the chamfering control module is connected to a chamfering control signal and a first reference low level signal, and is electrically connected to the N-th scan signal output terminal, and the chamfering control module is configured to pull down a potential of the N-th scan signal under control of the chamfering control signal and the first reference low level signal; and
  the pull-down module is connected to an (N+m)-th stage scan signal and a second reference low level signal, and is electrically connected to the first node and the N-th stage scan signal output terminal, and the pull-down module is configured to pull down the potential of the first node and the potential of the N-th stage scan signal after the chamfering control module pulls down the potential of the N-th stage scan signal under control of the (N+m)-th stage scan signal and the second reference low level.

In the present disclosure, the chamfering control module is added in the N-th stage GOA unit to carry out chamfering processing on the N-th stage scan signal, so that the output N-th stage scan signal is a chamfering wave, so as to reduce loss degree of the N-th stage scan signal G(n).

Alternatively, in some embodiments of the present disclosure, the pull-up control module comprises a first transistor, a gate of the first transistor and one of a source and a drain of the first transistor are connected to the (N−m)-th stage scan signal, and another one of the source and the drain of the first transistor is electrically connected to the first node.

In this embodiment, a circuit structure of the pull-up control module is simple and easy to simplify the process. In practical application, a potential of the first node can be controlled by controlling the on and off of the first transistor through the (N−m)-th stage scan signal, and a timing is simple.

Alternatively, in some embodiments of the present disclosure, the pull-up module comprises a second transistor, a gate of the second transistor is electrically connected to the first node, one of a source and a drain of the second transistor is connected to the clock signal, and another one of the source and the drain of the second transistor is electrically connected to the N-th stage scan signal output terminal.

In this embodiment, a circuit structure of the pull-up module is simple and easy to simplify the process. In practical application, the N-th stage scan signal can be outputted by controlling the on and off of the second transistor and the potential of the clock signal, and a timing is simple.

Alternatively, in some embodiments of the present disclosure, the chamfering control module comprises a third transistor, a gate of the third transistor is connected to the chamfering control signal, one of a source and a drain of the third transistor is connected to the first reference low level signal, and another one of the source and the drain of the third transistor is electrically connected to the N-th stage scan signal output terminal.

In this embodiment, a circuit structure of the pull-up module is simple and easy to simplify the process. In practical application, by controlling the on and off of the third transistor, the chamfering processing of the N-th stage scan signal can be realized, and a timing is simple.

Alternatively, in some embodiments of the present disclosure, the N-th stage scan signal has a chamfering width adjusted according to a duty ratio of the chamfering control signal and a chamfering depth adjusted according to a channel length-to-width ratio of the third transistor.

In this embodiment, according to specification requirements of the display panel, when preparing the GOA circuit, the channel length-to-width ratio of the third transistor can be designed according to the chamfering depth required by the N-th stage scan signal, and the process preparation can be carried out. Thus, each scan signal output by the GOA circuit has a corresponding chamfering depth, and it is not necessary to control the chamfering depth through subsequent signals.

Alternatively, in some embodiments of the present disclosure, the first reference low level signal and the second reference low level signal are same signals.

In this embodiment, setting the first reference low level signal and the second reference low-level signal as same signals can reduce the wires in the GOA circuit and reduce the production cost.

Alternatively, in some embodiments of the present disclosure, the pull-down module comprises a fourth transistor and a fifth transistor;

both a gate of the fourth transistor and a gate of the fifth transistor are connected to the (N+m)-th stage scan signal, one of a source and a drain of the fourth transistor and one of a source and a drain of the fifth transistor are connected to the second reference low level signal, and another one of the source and the drain of the fourth transistor and another one of the source and the drain of the fifth transistor are electrically connected to the first node.

In this embodiment, by setting the fourth transistor and the fifth transistor, the potential of the first node and the potential of the N-th stage scan signal can be pulled down simultaneously under control of the (N+m)-th stage scan signal and the second reference low level signal. The circuit structure and timing are simple, which is convenient to simplify the process.

Alternatively, in some embodiments of the present disclosure, the N-th stage scan signal has a chamfering width adjusted according to a duty ratio of the chamfering control signal and a chamfering depth adjusted according to a voltage amplitude of the first reference low level signal.

In this embodiment, the N-th stage scan signal is modulated by adjusting the duty ratio of the chamfering control signal and the voltage amplitude of the first reference low level signal, and the adjustment mode is more flexible. According to practical application, the N-th stage scan signal with the required chamfering waveform can be obtained, and the application range is wider.

Alternatively, in some embodiments of the present disclosure, a duty ratio of the chamfering control signal is less than a duty ratio of the N-th stage scan signal.

In this scheme, the duty ratio of the chamfering control signal is less than that of the N-th stage scan signal, and only the high potential close to the falling edge of the N-th stage scan signal is chamfered. While reducing the signal difference, the high potential of the N-th stage scan signal can be retained to prevent affecting the charging efficiency of the display panel.

Alternatively, in some embodiments of the present disclosure, the potential of the N-th stage scan signal is pulled down by the chamfering control module to a potential less than or equal to the second reference low level.

Accordingly, the present disclosure further provides a display panel, comprising a display area and a gate driver on array (GOA) circuit integrally disposed on an edge of the display area, wherein the GOA circuit may be any GOA circuit above.

The present disclosure provides a GOA circuit and a display panel. The GOA circuit comprises multi-stage cascaded GOA units. The N-th stage GOA unit comprises the pull-up control module, the pull-up module, the chamfering control module, and the pull-down module. Wherein, the chamfering control module is connected to the chamfering control signal and the first reference low level signal, and is electrically connected to the N-th stage scan signal output terminal to pull down the potential of the N-th stage scan signal before the pull-down module pulling down the potential of the first node and the potential of the N-th stage scan signal, under control of the chamfering control signal and the first reference low level signal. In the present disclosure, the chamfering control module is added in the N-th stage GOA unit to carry out chamfering processing on the N-th stage scan signal, so that the output N-th stage scan signal is a chamfering wave, so as to reduce loss degree of the N-th stage scan signal G(n), improve the display effect of the display panel, and reduce the production cost.

DESCRIPTION OF DRAWINGS

In order to more clearly explain technical solutions in embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DETAILED DESCRIPTION OF EMBODIMENTS

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

In the description of the present disclosure, it is to be understood that terms "first", "second" are for illustrative purposes only and are not to be construed as indicating or imposing a relative importance or implicitly indicating the number of technical features indicated. Thus, a feature that limited by "first", "second" may expressly or implicitly include at least one of the features, and therefore cannot be understood as a limitation on the present disclosure.

The present disclosure provides a GOA circuit and a display panel, which will be described in detail below. It should be noted that an order of description of the following embodiments is not a limitation on a preferred order of the embodiments of the present disclosure.

Figure 1:
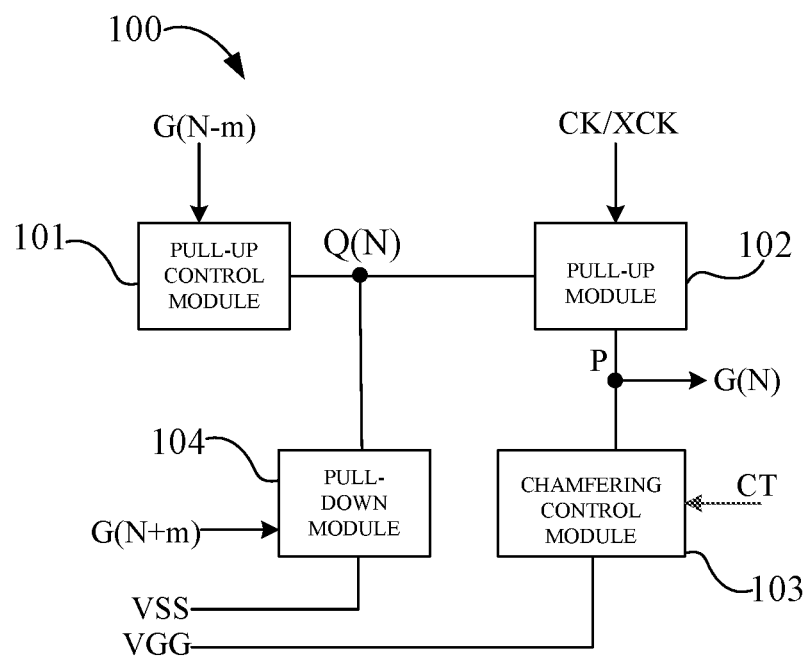
FIG. 1 is a schematic structural diagram of an N-th stage GOA unit according to the present disclosure.

Referring to FIG. 1, FIG. 1 is a schematic structural diagram of an N-th stage GOA unit according to the present disclosure. A GOA circuit is provided in the present disclosure. The GOA circuit comprises multi-stage cascaded GOA units. The N-th stage GOA unit 100 comprises a pull-up control module 101, a pull-up module 102, a chamfering control module 103, and a pull-down module 104.

The pull-up control module 101 is connected to an (N−m)-th stage scan signal G(N−m), and electrically connected to a first node Q(N). The pull-up control module 101 is configured to output the (N−m)-th stage scan signal G(N−m) to the first node Q(N) under the control of the (N−m)-th stage scan signal G(N−m).

The pull-up module 102 receives a clock signal and is electrically connected to the first node Q(N) and an N-th stage scan signal output terminal. The pull-up module 102 is configured to output an N-th stage scan signal G(N) under the control of a potential of the first node Q(N) and the clock signal.

It should be noted that the clock signal may be a current stage clock signal CK or a complementary clock signal XCK. The current stage clock signal CK and the complementary clock signal XCK remain inverted. When a potential of the clock signal CK(N) of the current stage is high, a potential of the complementary clock signal XCK is low. When the potential of the clock signal CKN of the current stage is low, the potential of the complementary clock signal XCK is high. For example, in the GOA circuit, when N is an odd number, the N-th stage GOA unit accesses the clock signal CK of the current stage. When N is an even number, the N-th stage GOA unit accesses the complementary clock signal XCK. Of course, the present disclosure is not limited thereto. In other embodiments of the present disclosure, the GOA circuit may also use only one clock signal.

The chamfering control module 103 is connected to a chamfering control signal CT and a first reference low level signal VGG, and is electrically connected to the N-th scan signal output terminal P. The chamfering control module 103 is configured to pull down the potential of the N-th stage scan signal G(N) under control of the chamfering control signal CT and the first reference low level signal VGG.

The pull-down module 104 is connected to an (N+m)-th scan signal G(N+m) and a second reference low level signal VSS, and is electrically connected to the first node Q(N) and the N-th level scan signal output terminal P. The pull-down module 104 is configured to pull down the potential of the first node Q(N) and the potential of the N-th level scan signal G(N) after the chamfering control module 103 pulls down the potential of the N-th level scan signal G(N) under the control of the (N+m)-th level scan signal G and the second reference low level VSS.

In the present disclosure, N and m are both integers greater than zero. The value of N may be determined according to a driving architecture of the display panel and the number of scan lines. The value of m can be determined from the cascade relationship between the GOA units in the GOA circuit. For example, m may be 1, 3, 4 or the like.

It should be noted that, in the GOA circuit, for front m stages of GOA units, if Nm, the (N−m)-th scan signal G(N−m) does not exist. Thus, in the front m stages of GOA units, a start signal may be provided in place of the scan signal G(N−m) to drive the pull-up control module 101 to operate.

In the GOA circuit provided in the present disclosure, the chamfering control module 103 is added to the N-th stage GOA unit 100, and the N-th stage scan signal G(N) is pulled down before the pull-down module 104 pulls down the potential of the first node Q(N), thereby performing the chamfering processing on the N-th stage scan signal G(N) so that the output N-th stage scan signal G(N) is a chamfering wave. This reduces the degree of loss of the N-th stage scan signal G (N) and improves the display effect of the display panel. In addition, compared with a conventional power integrated circuit chip (IC) in which the chamfering is realized by resistor voltage division, the chamfering control module 103 provided in the present disclosure greatly reduces the production cost of the display panel and improves the production efficiency.

In the present disclosure, the potential of the N-th level scan signal G(N) is pulled down by the chamfering control module 103 to a potential less than or equal to the second reference low level VSS.

Specifically, the chamfering control module 103 typically pulls down the N-th stage scan signal G(N) to a potential greater than the second reference low level signal VSS. Then, the pull-down module 104 continues to pull it down to the potential of the second reference low level signal VSS. Of course, it will be appreciated that the chamfering control module 103 may also pull down the N-th stage scan signal G(N) directly to the potential of the second reference low level signal VSS. Then, the pull-down module 104 may maintain the potential of the N-th stage scan signal G(N) at the potential of the second reference low level signal VSS. The details may be determined according to the chamfering process of the chamfering control module 103. The following embodiment will be described in detail, and details are not described herein.

Figure 2:
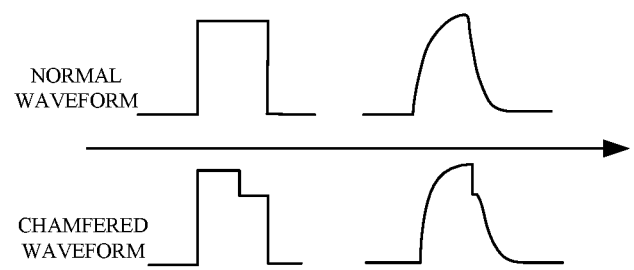
FIG. 2 is a schematic diagram of transmission losses of different waveforms of an N-th stage scan signal according to the present disclosure.

Referring specifically to FIG. 2, FIG. 2 is a schematic diagram of transmission loss of an N-th stage scan signal of different waveforms according to the present disclosure. With reference to FIGS. 1 and 2, it will be appreciated that the display panel is typically driven using two-sided GOA. The N-th stage scan signal G(N) outputted from the N-th stage GOA unit 100 needs to be transmitted from an edge position to a center position of the display panel. When the N-th stage scan signal G(N) is a normal waveform, the waveform of the N-th stage scan signal G(N) changes due to signal loss due to RC delay during transmission, affecting charging efficiency. When the N-th stage scan signal G(N) is a chamfering waveform, the N-th stage scan signal G(N) after chamfering is also a chamfering waveform after transmission loss. Therefore, the waveform difference between the N-th stage scan signal G(N) before the loss and the N-th stage scan signal G(N) after the loss is small, thereby reducing the difference between the N-th stage scan signal G(N) at different positions of the display panel.

Figure 3:
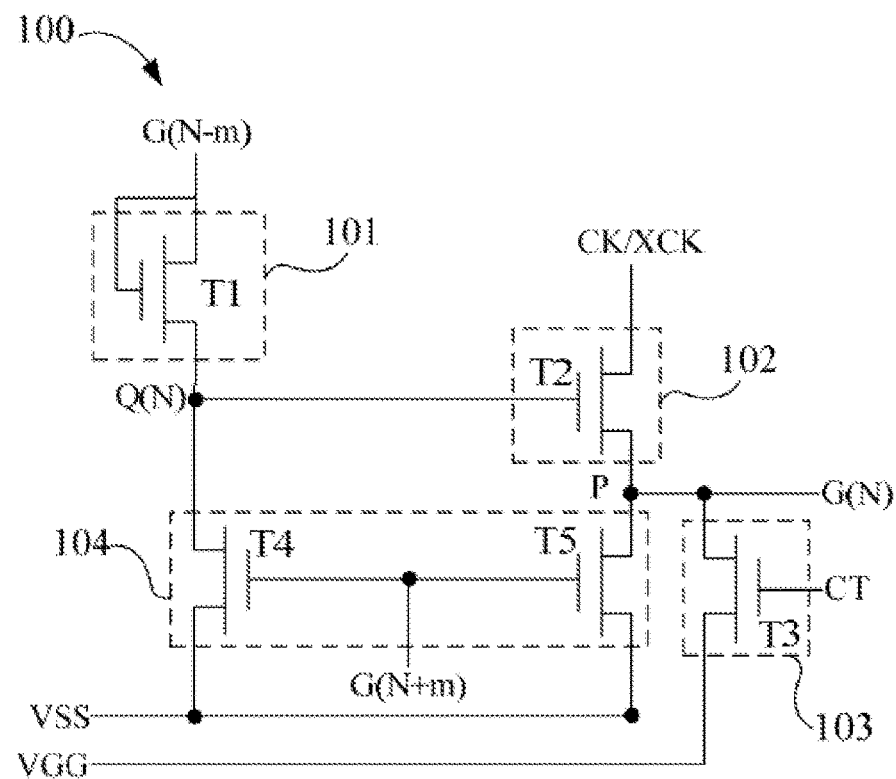
FIG. 3 is a schematic circuit diagram of an N-th stage GOA unit according to the present disclosure.

Referring to FIG. 3, FIG. 3 is a schematic circuit diagram of an N-th stage GOA unit according to the present disclosure. In the present disclosure, the pull-up control module 101 comprises a first transistor T1. Both a gate of the first transistor T1 and one of a source and a drain of the first transistor T1 are connected to the (N−m)-th stage scan signal G(N−m) Another one of the source and drain of the first transistor T1 is electrically connected to the first node Q(N). Of course, it will be appreciated that the pull-up control module 101 may also include a plurality of transistors in series, or a plurality of transistors operating alternately.

In the present disclosure, the pull-up module 102 includes a second transistor T2. A gate of the second transistor T2 is electrically connected to the first node Q (N). One of a source and a drain of the second transistor T2 is connected to a clock signal, such as a current stage clock signal CK1 or a complementary clock signal CK2. Another one of the source and drain of the second transistor T2 is electrically connected to the N-th stage scan signal output terminal P. Of course, it will be appreciated that the pull-up module 102 may also include a plurality of transistors in series.

In the present disclosure, the chamfering control module 103 comprises a third transistor T3. A gate of the third transistor T3 is connected to a chamfering control signal CT. One of a source and a drain of the third transistor T3 is connected to the first reference low level signal VGG. Another one of the source and the drain of the third transistor T3 is electrically connected to the N-th stage scan signal output terminal P.

In the present disclosure, the pull-down module 104 comprises a fourth transistor T4 and a fifth transistor T5. A gate of the fourth transistor T4 and a gate of the fifth transistor T5 are both connected to the (N+m)-th stage scan signal G(N+m). One of a source and a drain of the fourth transistor T4 and one of a source and a drain of the fifth transistor T5 are connected to the second reference low level signal VSS. Another one of the source and drain of the fourth transistor T4 and another one of the source and drain of the fifth transistor T5 are electrically connected to the first node Q(N).

The transistors used in the present disclosure may include two types of P-type transistors and/or N-type transistors. The P-type transistor is turned on when a gate is at a low level and turned off when the gate is at a high level. The N-type transistor is turned on when a gate is at a high level and turned off when the gate is at a low level. In addition, the transistors used in the present disclosure may be thin film transistors or field effect transistors or other devices having same characteristics. Since the sources and drains of the transistors used herein are symmetrical, the sources and drains thereof are interchangeable. In the present disclosure, to distinguish between two poles of a transistor other than a gate, one of the poles is referred to as a source and the other as a drain. In the figures, an intermediate terminal of a switching transistor is a gate, a signal input terminal is a source, and an output terminal is a drain. It should be noted that all the transistors in the following embodiments of the present disclosure are described by using an N-type transistor as an example, but they cannot be understood as a limitation to the present disclosure.

Figure 4:
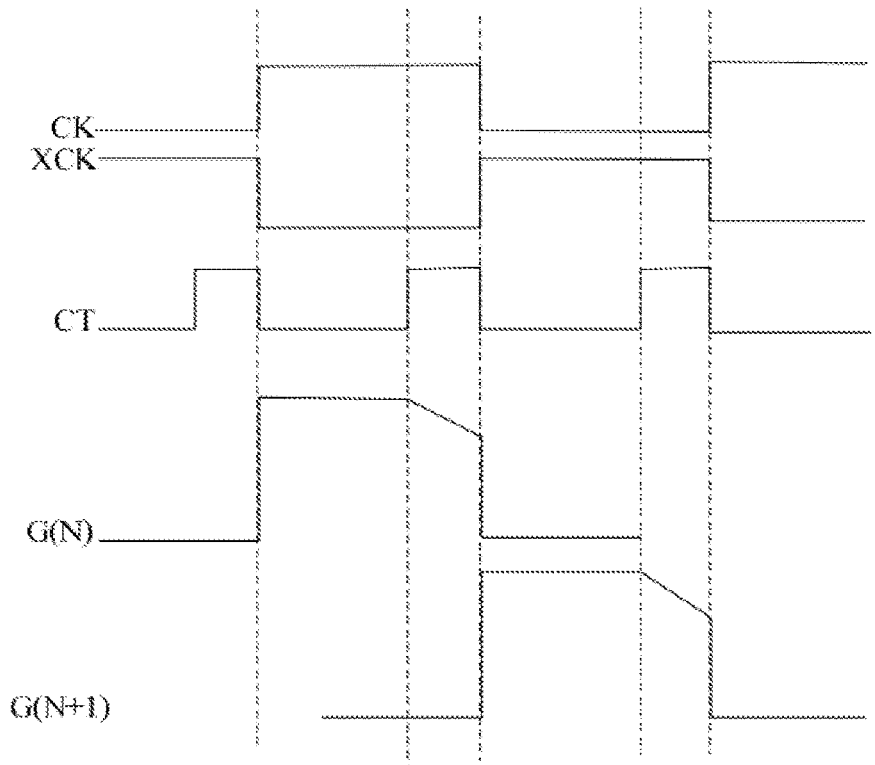
FIG. 4 is a signal timing diagram of an N-th stage GOA unit according to the present disclosure.

Referring specifically to FIG. 4, FIG. 4 is a schematic circuit diagram of an N-th stage GOA unit according to the present disclosure. In conjunction with FIGS. 3 and 4, the N-th stage GOA unit 100 comprises the following operating processes:

First, the first transistor T1 is turned on when the (N−m)-th stage scan signal G(N−m) is raised to a high potential. The potential of the first node Q(N) is pulled up to the potential of the (N−m)-th stage scan signal G(N−m). Since the potential of the first node Q(N) is pulled high, the second transistor T2 is turned on. The clock signal CK of this stage rises from a low potential to a high potential, thereby outputting the N-th stage scan signal G(N) at the N-th stage scan signal output terminal P through the second transistor T2.

Then, during the output of the N-th stage scan signal G(N), the chamfering control signal CT rises from the low potential to the high potential. The third transistor T3 is turned on. The N-th stage scan signal output P is in communication with the first reference low level signal VGG. Accordingly, the N-th stage scan signal G(N) is pulled down, and the waveform of the N-th stage scan signal G(N) is changed so that the N-th stage scan signal G (N) becomes a chamfering wave.

Next, the (N+m)-th stage scan signal G(N+m) rises from the low potential to the high potential, and both the fifth transistor T5 and the fourth transistor T4 are turned on. Both the first node Q(N) and the N-th stage scan signal output terminal P are in communication with the second reference low level signal VSS. That is, the potential of the first node Q(N) and the potential of the N-th stage scan signal G(N) are both pulled down to the potential of the second reference low level VSS.

Further, an output of an (N+1)-th stage scan signal G(N+1) and the chamfering process are cyclically reciprocated to output the multi-stage scan signal as described above.

It will be understood that in the present disclosure, the chamfering control module 103 is added to the N-th stage GOA unit 100, so that the N-th stage scan signal G(N) is first pulled down one step before the pull-down module 104 pulls down the N-th stage scan signal G(N), thereby realizing two-stage pull-down to achieve the purpose of the chamfering waveform of the output N-th stage scan signal G(N).

Figure 5:
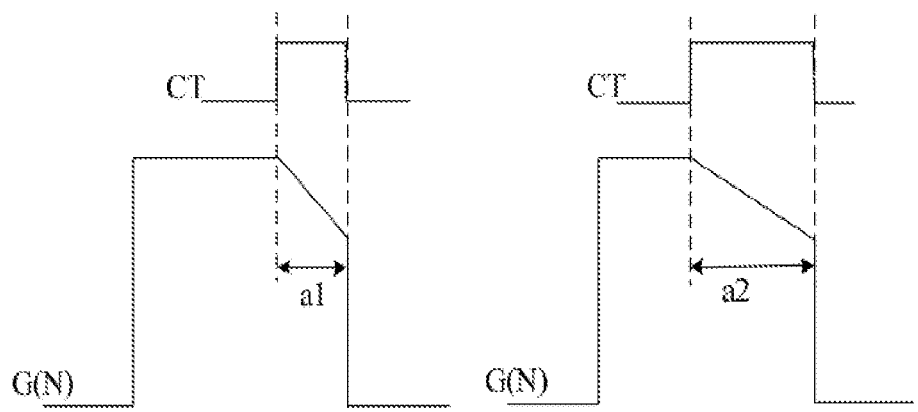
FIG. 5 is a schematic diagram of a first chamfering theory of an N-th stage scan signal according to the present disclosure.
Figure 6:
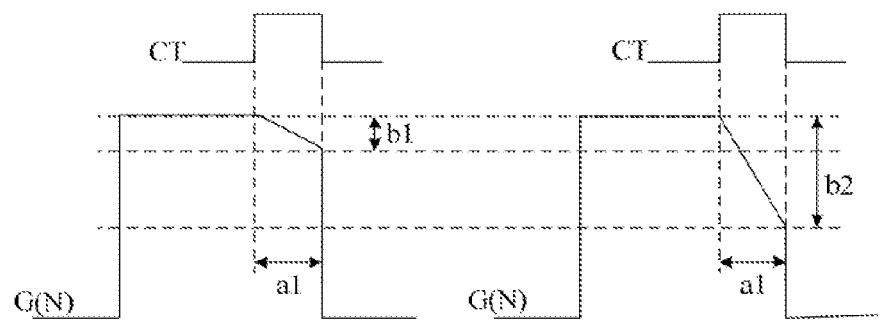
FIG. 6 is a schematic diagram of a second chamfering theory of an N-th stage scan signal according to the present disclosure.

Please refer to FIGS. 3, 5 and 6 at the same time. FIG. 5 is a schematic diagram of a first chamfering theory of an N-th stage scan signal according to the present disclosure. FIG. 6 is a schematic diagram of a second chamfering theory of an N-th stage scan signal provided by the present disclosure.

Wherein the N-th stage scan signal G(N) has a chamfering width and a chamfering depth. As shown in FIG. 5, the chamfering width is adjusted according to a duty ratio of the chamfering control signal CT. The duty cycle refers to a ratio of a energizing time to a total time in a pulse cycle. It will be understood that when the third transistor T3 is turned on, the N-th stage scan signal G(N) is pulled down by the first reference low level signal VGG. When the third transistor T3 is turned off, the pull-down operation is stopped. That is, the chamfering process of the N-th stage scan signal G(N) is a pull-down process of the N-th stage scan signal G(N). Therefore, a duration in which the N-th stage scan signal G(N) is pulled down in the chamfering process is the chamfering width of the N-th stage scan signal G(N).

For example, when a duration of the high level of the chamfering control signal CT is a1, the chamfering width of the N-th stage scan signal G(N) is a1. When the duration of the high level of the chamfering control signal CT is a2, the chamfering width of the N-th stage scan signal G(N) is a2. It can be seen that the larger the duty ratio of the chamfering control signal CT, the larger the chamfering width of the N-th scan signal G(N). Therefore, the chamfering width of the N-th stage scan signal G(N) can be adjusted by the duty ratio of the chamfering control signal CT.

As shown in FIGS. 3 and 6, the chamfering depth of the N-th stage scan signal G(N) may be adjusted according to a voltage amplitude of the first reference low-level signal VGG or a channel length-width ratio of the third transistor T3. From the above analysis, it can be seen that the chamfering process of the N-th stage scan signal G(N) is a pull-down process of the N-th stage scan signal G(N). A level height of the N-th stage scan signal G(N) is pulled down from an initial high level to an intermediate level or down to a low level during the time that the N-th stage scan signal G(N) is chamfered. Therefore, during the chamfering process, a level change amount of the N-th stage scan signal G(N) is the chamfering depth of the N-th stage scan signal G(N).

Specifically, when the duty ratio of the chamfering control signal CT is the same, the chamfering width of the N-th stage scan signal G(N) is the same. At this time, the greater the voltage amplitude of the first reference low level signal VGG, the greater the chamfering depth of the N-th-stage scan signal G(N). The larger the channel length-to-width ratio of the third transistor T3 is, the greater the chamfering depth of the N-th stage scan signal G(N) is. It will be understood that when the voltage amplitude of the first reference low level signal VGG is small, and/or the channel length-to-width ratio of the third transistor T3 are relatively small, a pull-down speed of the N-th stage scan signal G(N) is relatively slow. At this time, the chamfering depth of the N-th stage scan signal G(N) is small, and is b1. Similarly, when the voltage amplitude of the first reference low level signal VGG is large, and/or the channel length-to-width ratio of the third transistor T3 are large, the pull-down speed of the N-th stage scan signal G(N) is fast, and the pull-down amplitude is large in the same pull-down time. In this case, the scan signal G(N) of the N-th stage has a larger chamfering depth, and is b2.

In the present disclosure, the N-th stage scan signal G(N) may be chamfered in a plurality of ways. The waveform of the N-th stage scan signal G(N) may be modulated according to the chamfering control signal CT, the channel length-to-width ratio of the third transistor T3, and/or the voltage amplitude of the first reference low level signal VGG.

Figure 7:
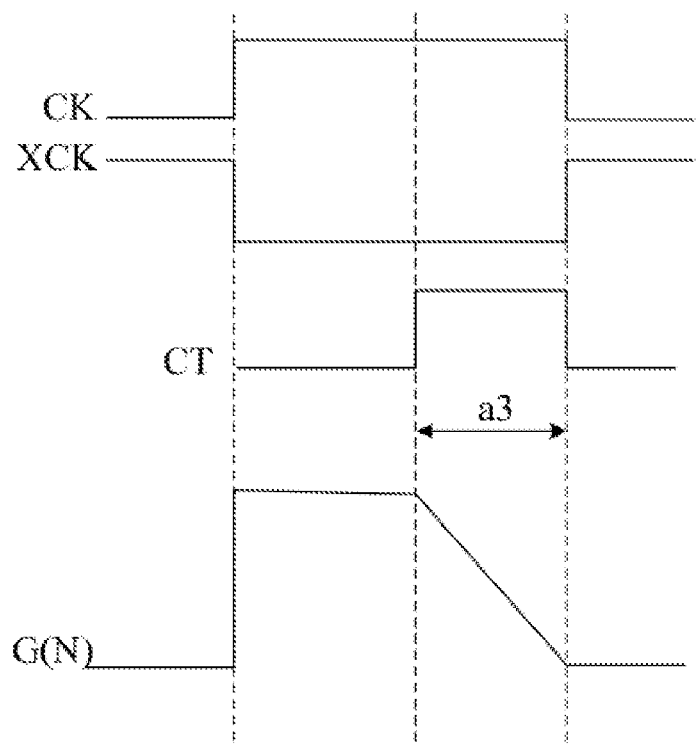
FIG. 7 is a schematic diagram of generation a first waveform of an N-th stage scan signal according to the present disclosure.

Referring specifically to FIG. 7, FIG. 7 is a schematic diagram of generating a first waveform of an N-th stage scan signal according to the present disclosure. In this embodiment, the duty ratio of the chamfering control signal CT is large, and the chamfering width of the N-th scan signal G(N) is a3. Meanwhile, the channel length-to-width of the third transistor T3 are relatively large, and/or the voltage amplitude of the first reference low level signal VGG is large, and the pull-down speed is fast. Thus, during the pull-down process, the N-th stage scan signal G(N) is pulled down directly from the high level to the low level. This low level may be equal to the potential of the second reference low level signal VSS.

Figure 8:
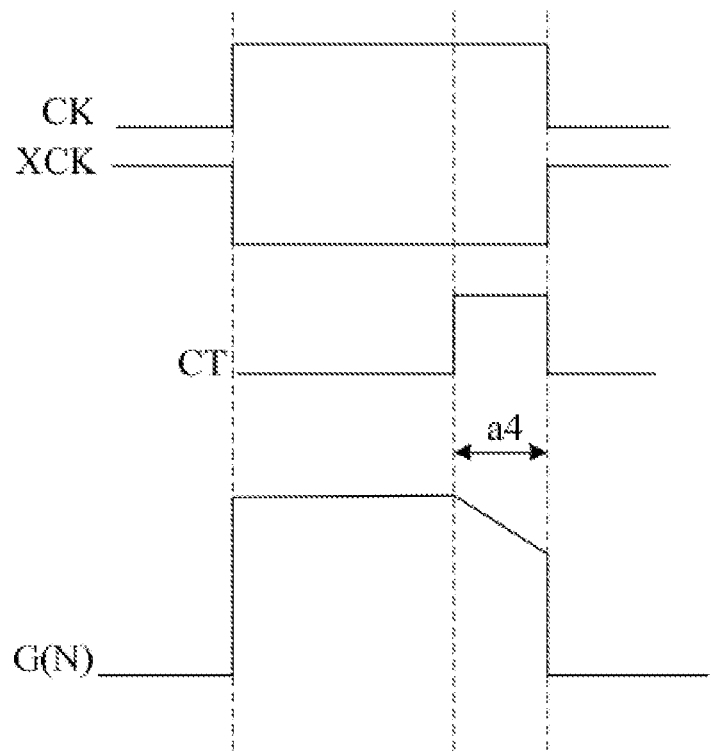
FIG. 8 is a schematic diagram of generation of a second waveform of an N-th stage scan signal according to the present disclosure.

Referring to FIG. 8, FIG. 8 is a schematic diagram of generating a second waveform of an N-th stage scan signal according to the present disclosure. In this embodiment, the duty ratio of the chamfering control signal CT is centered, and the chamfering width of the N-th scan signal G(N) is a4, a4<a3. At the same time, the channel length-to-width ratio of the third transistor T3 and/or the voltage amplitude of the first reference low level signal VGG are adjusted to a suitable range such that, during the pull-down process, the N-th stage scan signal G(N) is pulled down from the high level to an intermediate level and not down to the low level. This intermediate level is less than the potential of the second reference low level signal VSS.

Figure 9:
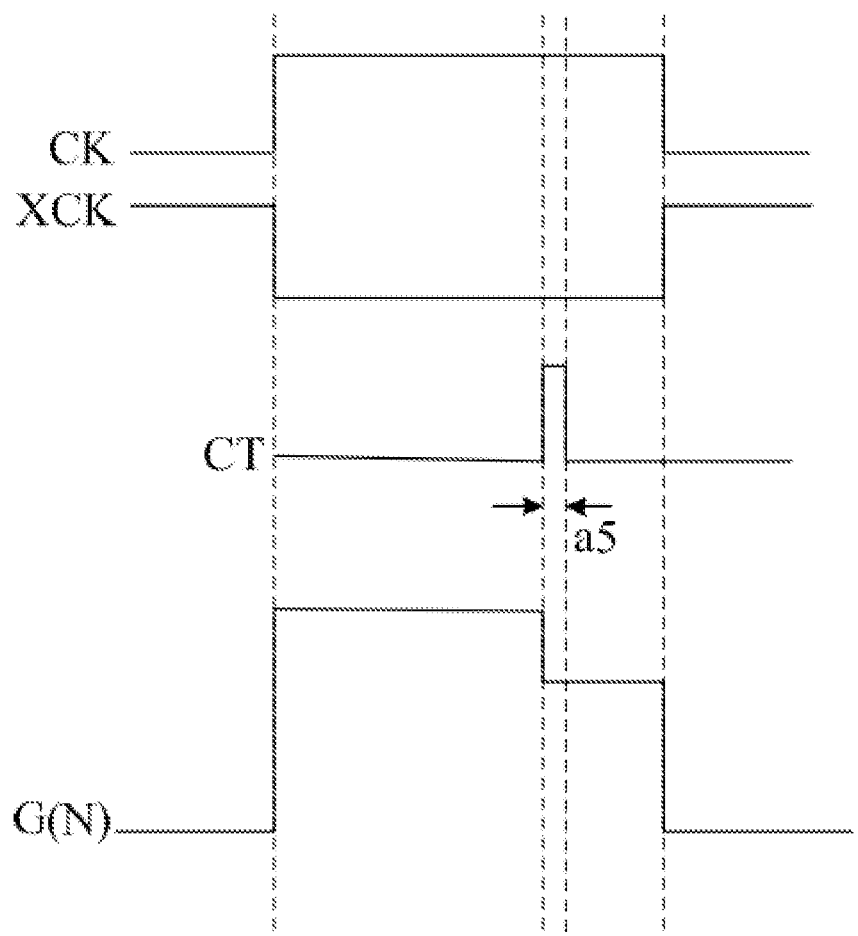
FIG. 9 is a schematic diagram of generation of a third waveform of an N-th stage scan signal according to the present disclosure.

Referring to FIG. 9, FIG. 9 is a schematic diagram of generating a third waveform of an N-th stage scan signal according to the present disclosure. In this embodiment, the duty ratio of the chamfering control signal CT is less, and the chamfering width of the N-th stage scan signal GN is a5, a5<a4<a3. Meanwhile, the channel length-to-width ratio of the third transistor T3 are relatively large, and/or the voltage amplitude of the first reference low level signal VGG is large, and the pull-down speed is extremely fast. The pull-down process is very short. Therefore, although the pull-down time is shorter than in FIG. 8, the voltage amplitude of the N-th stage scan signal G(N) can also be pulled down by a certain amplitude, and is not pulled down to the potential of the second reference low level signal VSS.

The waveforms of the N-th stage scan signal G (N) shown in FIGS. 7 to 9 are merely illustrative of the solution of the present disclosure and cannot be understood as a limitation of the present disclosure. According to actual demands, the N-th stage scan signal G(N) having the desired chamfering waveform can be obtained by adjusting the chamfering control signal CT, the channel length-to-width ratio of the third transistor T3, and/or the voltage amplitude of the first reference low level signal VGG.

In some embodiments of the present disclosure, the first reference low level signal VGG and the second reference low level signal VSS are the same signal. This reduces wires in the GOA circuit and reduces production costs. At this time, the voltage amplitude of the first reference low level signal VGG is fixed. Therefore, it is possible to adjust the chamfering depth of the N-th stage scan signal G(N) only by adjusting the channel length-to-width ratio of the third transistor T3.

In some embodiments of the present disclosure, the duty ratio of the chamfering control signal CT is less than the duty ratio of the N-th stage scan signal G(N). It will be understood that the waveform deterioration of the N-th stage scan signal G(N) is mainly reflected in a falling edge due to the transmission loss caused by RC delay. Therefore, in the present disclosure, the duty ratio of the chamfering control signal CT is set to be less than the duty ratio of the N-th stage scan signal G(N), and only the high potential close to the falling edge of the N-th stage scan signal G(N) is chamfered, so that the high potential of the N-th stage scan signal G(N) can be retained while the signal difference is reduced, thereby preventing affecting the charging efficiency of the display panel.

It should be noted that, in the GOA circuit provided in the present disclosure, the N-th stage GOA unit 100 comprises only the pull-up control module 101, the pull-up module 102, the chamfering control module 103, and the pull-down module 104, but is not understood as a limitation of the present disclosure. For example, in other embodiments of the present disclosure, the N-th stage GOA unit 100 may further comprise a reset module, a pull-down maintenance module, and the like, which are techniques well known to those skilled in the art and are not described herein again. That is, the chamfering control module 103 in the N-th stage GOA unit 100 provided herein may be applied to various types of GOA circuits.

Accordingly, the present disclosure further provides a display panel. The display panel comprises GOA circuitry. The GOA circuit is configured to provide a scan signal required for the display screen of the display panel. The GOA circuit is the GOA circuit described in any one of the above embodiments. For details, refer to the above description.

Figure 10:
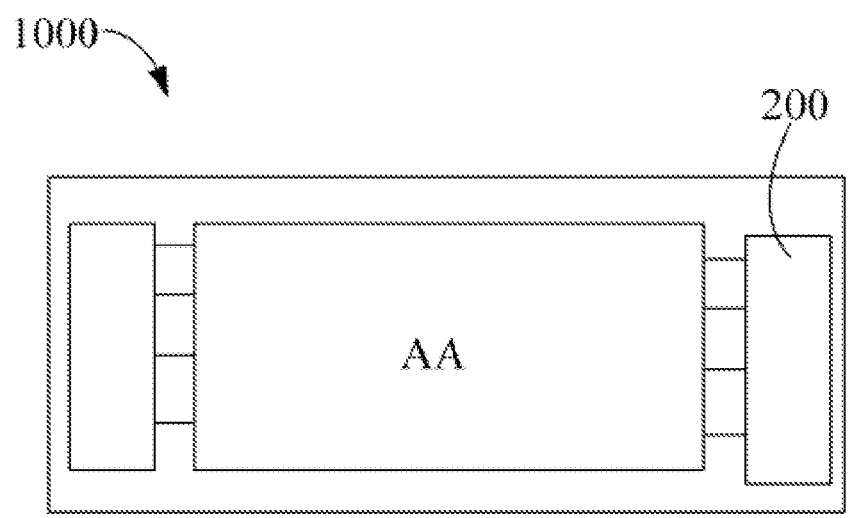
FIG. 10 is a schematic structural diagram of a display panel according to the present disclosure.

Referring to FIG. 10, FIG. 10 is a schematic structural diagram of a display panel according to the present disclosure. The display panel 1000 comprises a display area AA and GOA circuits 200 integrally disposed on edges of the display area AA. The GOA circuits 200 comprise multi-stage cascaded GOA units. The GOA circuits 200 are provided on both sides of the display panel 1000.

In the display panel 1000 provided herein, the N-th stage GOA unit comprises a pull-up control module, a pull-up module, a chamfering control module, and a pull-down module. In the present disclosure, the chamfering control module is added to the N-th stage GOA unit 100 to perform chamfering processing on the N-th stage scan signal, so that the output N-th stage scan signal is a chamfering wave, thereby reducing the loss degree of the N-th stage scan signal and improving the display effect of the display panel.

It should be noted that the display panel 1000 provided in the present disclosure is described by way of example in which the GOA circuits 200 are provided on both sides of the display area AA in a double-sided driving manner. However, it cannot be understood as a limitation to the present disclosure. In some embodiments, a one-side driving or other driving mode may be used according to actual requirements of the display panel 1000, which is specifically limited herein.

The GOA circuit and display panel provided in the present disclosure are described in detail above. The principles and embodiments of the present disclosure are described by using specific examples herein. The description of the embodiments is merely intended to help understand the method and core ideas of the present disclosure. At the same time, a person of ordinary skill in the art may make changes in the specific embodiments and application scope according to the idea of the present disclosure. In conclusion, the content of the specification should not be construed as a limitation to the present disclosure.

What is claimed is:

1. A gate driver on array (GOA) circuit, comprising multi-stage cascade GOA units, wherein an N-th stage GOA unit comprises a pull-up control module, a pull-up module, a chamfering control module, and a pull-down module;

the pull-up control module is connected to an (N−m)-th stage scan signal, and is electrically connected to a first node, and the pull-up control module is configured to output the (N−m)-th stage scan signal to the first node under control of the (N−m)-th stage scan signal, wherein N and m are integers greater than zero, and N>m;

the pull-up module is connected to a clock signal and is electrically connected to the first node and an N-th stage scan signal output terminal, and the pull-up module is configured to output the N-th stage scan signal under control of a potential of the first node and the clock signal;

the chamfering control module is connected to a chamfering control signal and a first reference low level signal, and is electrically connected to the N-th scan signal output terminal, and the chamfering control module is configured to pull down a potential of the N-th scan signal under control of the chamfering control signal and the first reference low level signal; and the pull-down module is connected to an (N+m)-th stage scan signal and a second reference low level signal, and is electrically connected to the first node and the N-th stage scan signal output terminal, and the pull-down module is configured to pull down the potential of the first node and the potential of the N-th stage scan signal after the chamfering control module pulls down the potential of the N-th stage scan signal under control of the (N+m)-th stage scan signal and the second reference low level signal;

wherein the pull-down module comprises a fourth transistor and a fifth transistor;

the fourth transistor comprises a first terminal, a second terminal, and a third terminal, the fifth transistor comprises a first terminal, a second terminal, and a third terminal, both the first terminal of the fourth transistor and the first terminal of the fifth transistor are connected to the (N+m)-th stage scan signal, the second terminal of the fourth transistor and the second terminal of the fifth transistor are connected to the second reference low level signal, and the third terminal of the fourth transistor and the third terminal of the fifth transistor are electrically connected to the first node.

2. The GOA circuit according to claim 1, wherein the pull-up control module comprises a first transistor, a gate of the first transistor and one of a source and a drain of the first transistor are connected to the (N−m)-th stage scan signal, and another one of the source and the drain of the first transistor is electrically connected to the first node.

3. The GOA circuit according to claim 1, wherein the pull-up module comprises a second transistor, a gate of the second transistor is electrically connected to the first node, one of a source and a drain of the second transistor is connected to the clock signal, and another one of the source and the drain of the second transistor is electrically connected to the N-th stage scan signal output terminal.

4. The GOA circuit according to claim 1, wherein the chamfering control module comprises a third transistor, a gate of the third transistor is connected to the chamfering control signal, one of a source and a drain of the third transistor is connected to the first reference low level signal, and another one of the source and the drain of the third transistor is electrically connected to the N-th stage scan signal output terminal.

5. The GOA circuit according to claim 4, wherein the N-th stage scan signal has a chamfering width adjusted according to a duty ratio of the chamfering control signal and a chamfering depth adjusted according to a channel length-to-width ratio of the third transistor.

6. The GOA circuit according to claim 5, wherein the first reference low level signal and the second reference low level signal are same signals.

7. The GOA circuit according to claim 1, wherein the first terminal of the fourth transistor is a gate of the fourth transistor, the second terminal of the fourth transistor is a source of the fourth transistor, the third terminal of the fourth transistor is a drain of the fourth transistor, the first terminal of the fifth transistor is a gate of the fifth transistor, the second terminal of the fifth transistor is a source of the fifth transistor, and the third terminal of the fifth transistor is a drain of the fifth transistor;

both the gate of the fourth transistor and the gate of the fifth transistor are connected to the (N+m)-th stage scan signal, one of the source and the drain of the fourth transistor and one of the source and the drain of the fifth transistor are connected to the second reference low level signal, and another one of the source and the drain of the fourth transistor and another one of the source and the drain of the fifth transistor are electrically connected to the first node.

8. The GOA circuit according to claim 1, wherein the N-th stage scan signal has a chamfering width adjusted according to a duty ratio of the chamfering control signal and a chamfering depth adjusted according to a voltage amplitude of the first reference low level signal.

9. The GOA circuit according to claim 1, wherein a duty ratio of the chamfering control signal is less than a duty ratio of the N-th stage scan signal.

10. The GOA circuit according to claim 1, wherein the potential of the N-th stage scan signal is pulled down by the chamfering control module to a potential less than or equal to the second reference low level signal.

11. A display panel, comprising a display area and a gate driver on array (GOA) circuit integrally disposed on an edge of the display area, wherein the GOA circuit comprises multi-stage cascade GOA units, an N-th stage GOA unit comprises a pull-up control module, a pull-up module, a chamfering control module, and a pull-down module;

the pull-up control module is connected to an (N−m)-th scan signal, and is electrically connected to a first node, and the pull-up control module is configured to output the (N−m)-th stage scan signal to the first node under control of the (N−m)-th stage scan signal, wherein N and m are integers greater than zero, and N>m;

the pull-up module is connected to a clock signal and is electrically connected to the first node and an N-th stage scan signal output terminal, and the pull-up module is configured to output the N-th stage scan signal under control of a potential of the first node and the clock signal;

the chamfering control module is connected to a chamfering control signal and a first reference low level signal, and is electrically connected to the N-th scan signal output terminal, and the chamfering control module is configured to pull down a potential of the N-th scan signal under control of the chamfering control signal and the first reference low level signal; and the pull-down module is connected to an (N+m)-th stage scan signal and a second reference low level signal, and is electrically connected to the first node and the N-th stage scan signal output terminal, and the pull-down module is configured to pull down the potential of the first node and the potential of the N-th stage scan signal after the chamfering control module pulls down the potential of the N-th stage scan signal under control of the (N+m)-th stage scan signal and the second reference low level signal;

wherein the pull-down module comprises a fourth transistor and a fifth transistor;

the fourth transistor comprises a first terminal, a second terminal, and a third terminal, the fifth transistor comprises a first terminal, a second terminal, and a third terminal, both the first terminal of the fourth transistor and the first terminal of the fifth transistor are connected to the (N+m)-th stage scan signal, the second terminal of the fourth transistor and the second terminal of the fifth transistor are connected to the second reference low level signal, and the third terminal of the fourth transistor and the third terminal of the fifth transistor are electrically connected to the first node.

12. The display panel according to claim 11, wherein the pull-up control module comprises a first transistor, a gate of the first transistor and one of a source and a drain of the first transistor are connected to the (N−m)-th stage scan signal, and another one of the source and the drain of the first transistor is electrically connected to the first node.

13. The display panel according to claim 11, wherein the pull-up module comprises a second transistor, a gate of the second transistor is electrically connected to the first node, one of a source and a drain of the second transistor is connected to the clock signal, and another one of the source and the drain of the second transistor is electrically connected to the N-th stage scan signal output terminal.

14. The display panel according to claim 11, wherein the chamfering control module comprises a third transistor, a gate of the third transistor is connected to the chamfering control signal, one of a source and a drain of the third transistor is connected to the first reference low level signal, and another one of the source and the drain of the third transistor is electrically connected to the N-th stage scan signal output terminal.

15. The display panel according to claim 14, wherein the N-th stage scan signal has a chamfering width adjusted according to a duty ratio of the chamfering control signal and a chamfering depth adjusted according to a channel length-to-width ratio of the third transistor.

16. The display panel according to claim 11, wherein the first terminal of the fourth transistor is a gate of the fourth transistor, the second terminal of the fourth transistor is a source of the fourth transistor, the third terminal of the fourth transistor is a drain of the fourth transistor, the first terminal of the fifth transistor is a gate of the fifth transistor, the second terminal of the fifth transistor is a source of the fifth transistor, and the third terminal of the fifth transistor is a drain of the fifth transistor;

both the gate of the fourth transistor and the gate of the fifth transistor are connected to the (N+m)-th stage scan signal, one of the source and the drain of the fourth transistor and one of the source and the drain of the fifth transistor are connected to the second reference low level signal, and another one of the source and the drain of the fourth transistor and another one of the source and the drain of the fifth transistor are electrically connected to the first node.

17. The display panel according to claim 11, wherein the N-th stage scan signal has a chamfering width adjusted according to a duty ratio of the chamfering control signal and a chamfering depth adjusted according to a voltage amplitude of the first reference low level signal.

18. The display panel according to claim 11, wherein a duty ratio of the chamfering control signal is less than a duty ratio of the N-th stage scan signal.

19. The display panel according to claim 11, wherein the potential of the N-th stage scan signal is pulled down by the chamfering control module to a potential less than or equal to the second reference low level signal.

20. A gate driver on array (GOA) circuit, comprising multi-stage cascade GOA units, wherein an N-th stage GOA unit comprises a pull-up control module, a pull-up module, a chamfering control module, and a pull-down module;

the pull-up control module is connected to an (N−m)-th stage scan signal, and is electrically connected to a first node, and the pull-up control module is configured to output the (N−m)-th stage scan signal to the first node under control of the (N−m)-th stage scan signal, wherein N and m are integers greater than zero, and N>m;

the pull-up module is connected to a clock signal and is electrically connected to the first node and an N-th stage scan signal output terminal, and the pull-up module is configured to output the N-th stage scan signal under control of a potential of the first node and the clock signal;

the chamfering control module is connected to a chamfering control signal and a first reference low level signal, and is electrically connected to the N-th scan signal output terminal, and the chamfering control module is configured to pull down a potential of the N-th scan signal under control of the chamfering control signal and the first reference low level signal; and the pull-down module comprises a fourth transistor and a fifth transistor, both a gate of the fourth transistor and a gate of the fifth transistor are connected to an (N+m)-th stage scan signal, one of a source and a drain of the fourth transistor and one of a source and a drain of the fifth transistor are connected to a second reference low level signal, another one of the source and the drain of the fourth transistor and another one of the source and the drain of the fifth transistor are electrically connected to the first node, the pull-down module is configured to pull down the potential of the first node and the potential of the N-th stage scan signal after the chamfering control module pulls down the potential of the N-th stage scan signal under control of the (N+m)-th stage scan signal and the second reference low level signal.

\* \* \* \* \*